US 6,442,733 B1

(12) United States Patent
Fujiwara et al.

(10) Patent No.: US 6,442,733 B1
(45) Date of Patent: Aug. 27, 2002

(54) FAILURE ANALYZING METHOD AND APPARATUS USING TWO-DIMENSIONAL WAVELET TRANSFORMS

(75) Inventors: Teruaki Fujiwara; Kazuyuki Maruo; Takahiro Yamaguchi, all of Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 09/299,798

(22) Filed: Apr. 26, 1999

(30) Foreign Application Priority Data

Apr. 27, 1998 (JP) .......................................... 10-116627

(51) Int. Cl.⁷ .......................... G06F 17/50; G06F 11/00
(52) U.S. Cl. ........................................... 716/4; 714/704
(58) Field of Search ............................. 716/4; 714/704

(56) References Cited

U.S. PATENT DOCUMENTS

| 5,844,850 A | * | 12/1998 | Tsutsui et al. | ............... | 365/200 |
| 5,940,815 A | * | 8/1999 | Maeda et al. | ................. | 706/12 |
| 5,983,372 A | * | 11/1999 | Fujiwara | ..................... | 714/704 |
| 6,016,278 A | * | 1/2000 | Tsutsui et al. | ............... | 365/200 |
| 6,091,846 A | * | 7/2000 | Lin et al. | ..................... | 382/145 |
| 6,205,239 B1 | * | 3/2001 | Lin et al. | ..................... | 382/149 |
| 6,292,582 B1 | * | 9/2001 | Lin et al. | ..................... | 382/149 |

OTHER PUBLICATIONS

Y. Sakai et al., A Wafer Scale Fail Bit Analysis System for VLSI Memory Yield Improvement, Proceedings of the 1990 International Conference on Microelectronic Test Structures, pp. 175–178, Mar. 5, 1990.*

A.K. Chan et al., The Performance Impact of Data Placement for Wavelet Decomposition of Two–Dimensional Image Data on SIMD Machines, Fifth Symposium on the Fromtiers of Massively Parallel Computation, pp. 246–251, Feb. 6, 1995.*

* cited by examiner

Primary Examiner—Matthew Smith
Assistant Examiner—A. M. Thompson
(74) Attorney, Agent, or Firm—David N. Lathrop, Esq.; Gallagher & Lathrop

(57) ABSTRACT

There is provided a failure analyzing apparatus and a failure analyzing method which are capable of automatically finding a failure address and the number of failures from a fail bit map obtained from the test result of an IC memory. The fail bit map is two-dimensional Wavelet-transformed, and the X directional high-pass and the Y directional low-pass information (the longitudinal component) $X_{HL}(i, j)$ of the two-dimensional Wavelet-transformed result is added up for each i in the Y direction to create a histogram. A failure address X is found from an address i having an added value other than zero, and the number of failures is found from the absolute value of the added value. In addition, the fail bit map is scanned in the Y direction for each of the failure addresses to output a Y address at which the map changes from a pass to a failure and a Y address at which the map changes from a failure to a pass as well as the number of failures between those two Y addresses.

11 Claims, 11 Drawing Sheets

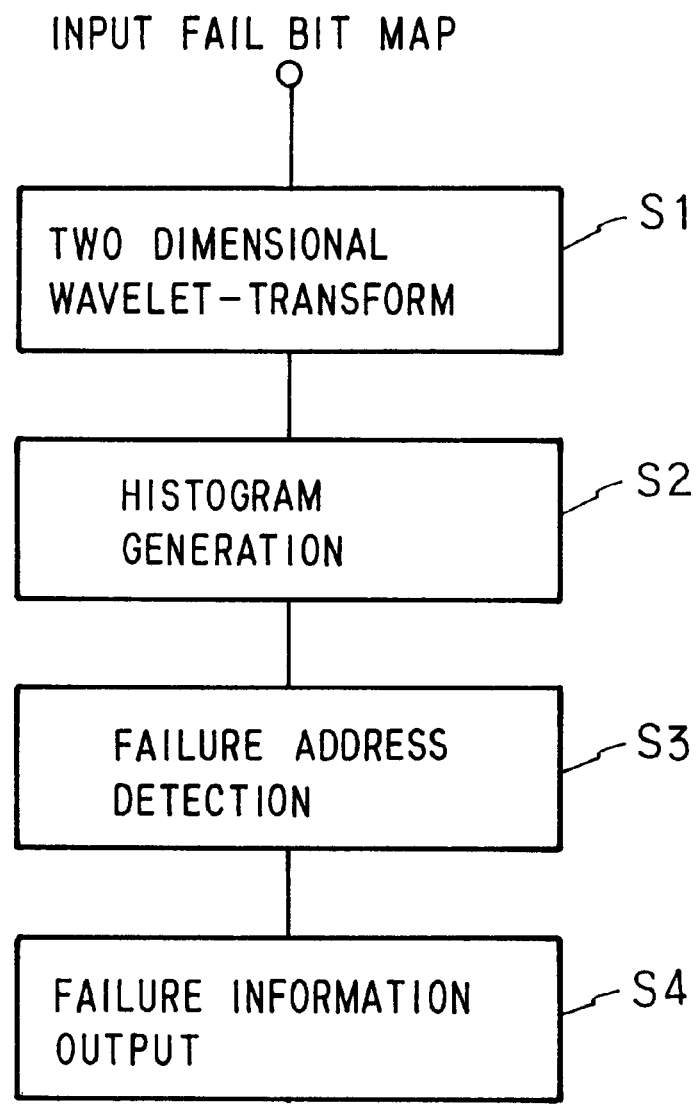

ORIGINAL IMAGE — 51

52L  52H

53LL  53HL

53LH  53HH

FAILURE ANALYZING METHOD AND APPARATUS USING TWO-DIMENSIONAL WAVELET TRANSFORMS

BACKGROUND OF THE INVENTION

1. Field of the Invention

The present invention relates to a failure analyzing method and a failure analyzing apparatus which detect a feature of failures from a fail bit map (a map showing addresses of a semiconductor device at which failures have been detected) created, for example, in a testing or inspection process of a semiconductor integrated circuit or the like.

2. Description of the Related Art

In a testing or inspection process of a semiconductor integrated circuit, the test or inspection result of "an integrated circuit in which memory cells are arranged in an array" such as a DRAM (Dynamic Random Access Memory) and the like is constituted by pass bits each of which means a normally operating portion and failure bits each of which means an abnormally operating portion, i.e., a failure or defect. This test result is outputted as a fail bit map from a semiconductor testing or inspecting apparatus.

It is very important in improving the production yield of semiconductor products to specify failure addresses and the number of failures of the tested integrated circuit utilizing the fail bit map, and to analyze a cause of occurrence thereof and feed it back to the manufacturing line. Usually, the analysis of a fail bit map is realized by creating a visual binary image constructed such that, for example, a pass bit has a value "1" and a failure bit has a value "0" on a fail bit map display. The displayed information is observed by a person or operator who analyzes the position and cause of failure. However, as a high integration density of circuits goes on, the fail bit map becomes huge. For example, a fail bit map having 1024×1024 bits cannot be displayed on a screen of a display device having a resolution of 512×512 pixels. For this reason, a fail bit map must be displayed on several screens by dividing the fail bit map into several pieces.

Since a person or operator must precisely observe any failure which may occur at any address of an image (map) having a big size, the analysis work is very troublesome. In addition, it is anticipated that an error probably occurs in the measurements of failure addresses and of the number of failures. Therefore, there is an increased need for a technology for displaying a fail bit map having a large number of data to be displayed, as in the case of a memory device having its capacity of equal to or larger than 1 megabit (Mbit), on a single screen of the display to make the analysis work easy, or a technology for automating the analysis work for the fail bit map itself, which has conventionally been performed by a person.

Heretofore, in order to display a fail bit map having a large number of display data on a single screen of the display, there has been utilized a technology for compressing and displaying a binary image of a fail bit map. In this technology, a fail bit map is divided into a plurality of blocks each having, for example, 2×2 bits, and each block is displayed by one pixel. Each pixel is displayed by use of a different color from one another depending on the number of failure bits contained in the corresponding block. For example, if each block has 2×2 bits, five colors are used to display the compressed fail bit map since the number of failure bits in one block is five from 0 to 4. By this procedure, a fail bit map having 1024×1024 bits can be displayed on the screen of a display device having 512×512 pixels, and hence it is possible that such fail bit map having a large volume of data can be analyzed on a single screen. In addition, in the case that the integration density of circuits is increased even more, and that a fail bit map having 2048×2048 bits should be analyzed, it is possible to analyze such fail bit map on a single screen of the display by dividing and compressing the fail bit map into a plurality of blocks, each having 4×4 bits.

Next, problems probably occurring in the case of utilizing the technology for compressing and displaying a fail bit map will be described. In the case of compressing a fail bit map having, for example, 2048×2048 bits into 512×512 pixels, one pixel must have information of 4×4 bits. Since each pixel is classified by a color depending on the number of failures contained therein, the pixels of the fail bit map have to be classified using 17 different colors corresponding to the failure number of 0 to 16 in this case. From now on, as the memory capacity of a memory device is further increased such as 256 Mbits, 1 gigabit (Gbit) or the like, the number of colors required for displaying each pixel is increased in proportion to the memory capacity of memory device. If the number of colors for displaying each pixel is increased, a problem occurs that it is difficult to grasp the number of failure bits from the color of each pixel. In addition, in the prior art, since a compressed fail bit map is displayed on a screen of the display and the displayed fail bit map is ultimately observed by a person, the problem remains unsolved that the failure addresses and the number of failures must be precisely measured by human eyes in detail.

SUMMARY OF THE INVENTION

It is an object of the present invention to provide a failure analyzing method which is capable of automatically performing, from a created fail bit map, an analysis work of the failure addresses of the map and the number of failures therein, which has been conventionally performed by a person.

It is an another object of the present invention to provide a failure analyzing apparatus which is capable of automatically performing, from a fail bit map, an analysis work of the failure addresses of the map and the number of failures therein.

In a first aspect of the present invention, in order to attain the above object, there is provided a failure analyzing apparatus for extracting failure information from a fail bit map comprising: two-dimensional Wavelet-transforming means for applying two-dimensional Wavelet-transform to an inputted fail bit map.

In a second aspect of the present invention, in order to attain the above object, there is provided a failure analyzing apparatus for extracting failure information from a fail bit map comprising: two-dimensional Wavelet-transforming means for applying two-dimensional Wavelet-transform to an inputted fail bit map; and histogram producing means for adding up Wavelet coefficients in Y direction with respect to X directional high-pass and Y directional low-pass information in the result of two-dimensional Wavelet-transform to create an X address histogram, and for adding up Wavelet coefficients in X direction with respect to X directional low-pass and Y directional high-pass information in the result of two-dimensional Wavelet-transform to create a Y address histogram.

In a preferred embodiment, the failure analyzing apparatus further includes: failure information outputting means for defining as failure addresses an X address having an added value other than zero in the X address histogram obtained by said histogram producing means and a Y address having an added value other than zero in the Y address histogram obtained by said histogram producing means, and outputting the added value of said X address in the histogram and the added value of said Y address in the histogram as the numbers of failures respectively.

In addition, it is preferred that the failure analyzing apparatus further includes: decision means for determining whether or not the number of failures is equal to the amount of X address or Y address of the inputted fail bit map; means for outputting, when said decision means determines that the number of failures is equal to the amount of X address or Y address of the inputted fail bit map, information representing that the failures extend over the corresponding entire X address or Y address; and failure address detecting means for scanning, when said decision means determines that the number of failures is not equal to the amount of X address or Y address of the inputted fail bit map, the X address or the Y address in which the failures are present in the inputted fail bit map or in the Wavelet-transformed result of the fail bit map, thereby to detect a starting address of the failures and an ending address of the failures.

Further, the failure analyzing apparatus may include: determining means for determining whether or not the number of failures is one; and one bit failure determining means for determining, when said determining means determines that the number of failures is one, whether or not the failure is a one bit failure.

It is preferred that a basic function of the two-dimensional Wavelet-transforming means is a redundant Haar-Wavelet-transform in which a shift parameter for Haar-Wavelet-transform is set to 1.

In a third aspect of the present invention, in order to attain the above object, there is provided a failure analyzing method comprising the steps of: applying two-dimensional Wavelet-transform to an inputted fail bit map; adding up Wavelet coefficients, with respect to a component including high-pass information in the result of the two-dimensional Wavelet-transform, in a specified direction of high-pass information producing process to create a histogram; and analyzing a failure address and the number of failures from the histogram.

In a preferred embodiment, the failure analyzing method further includes the step of; finding a failure address based on an address having an added value other than zero in the histogram, and finding the number of failures for the failure bit from the added value in the histogram of the address corresponding to the failure address.

In addition, it is preferred that the failure analyzing method further includes the steps of: determining whether or not the failure bit of the found failure address extends over the corresponding entire address in the fail bit map from the number of the failure bit; and scanning, when the failure bit of the found failure address does not extend over the corresponding entire address in the fail bit map, the inputted fail bit map or the Wavelet-transformed result at the failure address to find a starting address of the failures and an ending address of the failures as well as the number of failures present between the starting address and the ending address.

Further, the failure analyzing method may include the step of: adding up Wavelet coefficients, when the failure number of the failure bit is one, in the direction of high-pass information producing process orthogonal to the specified direction of high-pass information producing process to create a second histogram, applying a similar processing to said second histogram to find a failure address and the number of failures, and determining whether the failure is one bit failure or not using the failure address and the number of failures as well as the previously found failure address and the number of failures.

BRIEF DESCRIPTION OF THE DRAWINGS

FIG. 2 is a flow-chart showing a basic procedure of the failure analyzing method according to the present invention;

FIG. 8 is a diagram for explaining the relationship between an original image, an image of the one-dimensional Wavelet-transform result of the original image, and an image of the two-dimensional Wavelet-transform result of the original image, wherein

DETAILED DESCRIPTION OF THE PREFERRED EMBODIMENTS

Figure 1A:
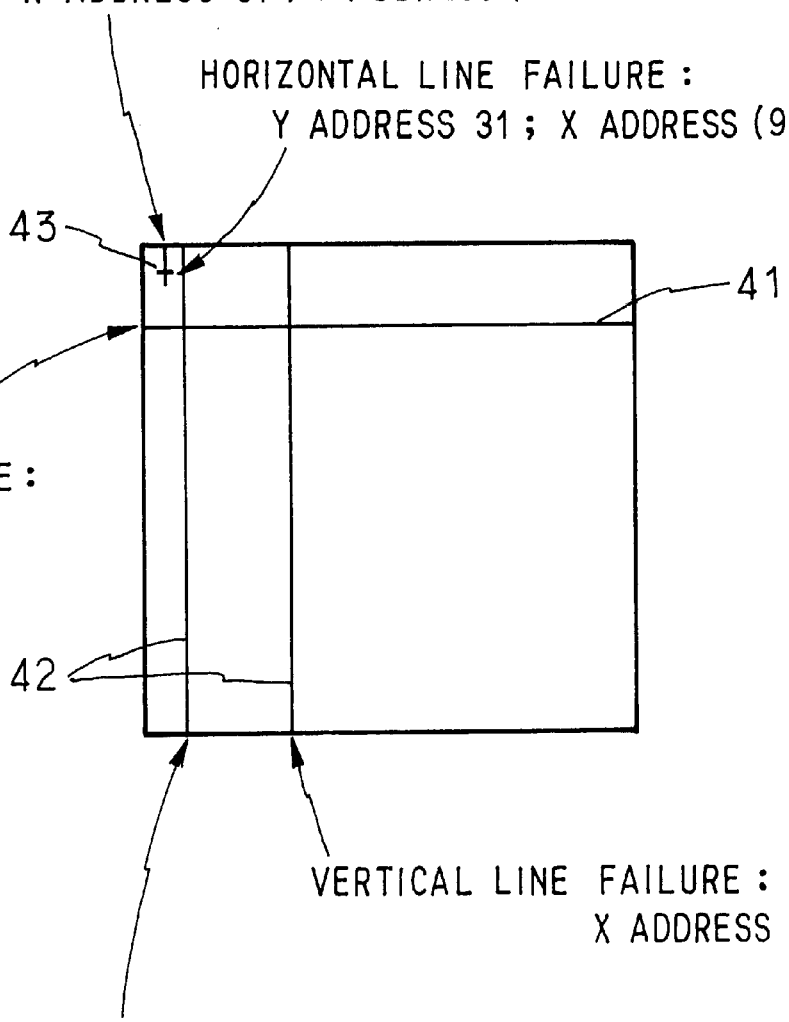
FIG. 1(A) is a diagram showing a sample image of the fail bit map.

At first, Wavelet-transform used in the present invention will be described. Since Wavelet-transform is described and explained in detail in "An Introduction to WAVELETS", by CHUI, Academic Press, 1992, a detailed explanation of Wavelet-transform will be omitted. First, a one-dimensional Wavelet-will be explained.

Although there are many basic functions available for performing Wavelet-transform, the explanation of Wavelet-transform will be given here using Haar-Wavelet having the shortest filter length of the basic function among the basic functions. Other Wavelet basic functions are different only in the form of function, and outputted information is substantially the same as Haar-Wavelet. Wavelet-transform is composed of two orthogonalized functions one of which is a scaling function and the other of which is a Wavelet function. The scaling function is a function which outputs smoothing information (equivalent to low-pass information) of data and the Wavelet function is a function which outputs detailed information (equivalent to high-pass information) of data. In the case of Haar-Wavelet, the scaling function is $g0=g1=\frac{1}{2}$, and the Wavelet function is $h0=\frac{1}{2}$ and $h1=-\frac{1}{2}$.

When Haar-Wavelet-transform is applied to an input signal $x(n)$ ($0 \leq n \leq 15$; n is an integer), the result $X(N)$ of Haar-Wavelet-transform is as follows:

$$X(0) = g0 \cdot x(0) + g1 \cdot x(1), \quad X(8) = h0 \cdot x(0) + h1 \cdot x(1)$$
$$X(1) = g0 \cdot x(2) + g1 \cdot x(3), \quad X(9) = h0 \cdot x(2) + h1 \cdot x(3)$$
$$X(2) = g0 \cdot x(4) + g1 \cdot x(5), \quad X(10) = h0 \cdot x(4) + h1 \cdot x(5)$$
$$\vdots \qquad\qquad\qquad \vdots$$
$$X(7) = g0 \cdot x(14) + g1 \cdot x(15), \quad X(15) = h0 \cdot x(14) + h1 \cdot x(15)$$

Let's input a specific signal to this Haar-Wavelet-transform result. For example, the following input signal $x(n)$ is inputted.

$$x(n) = \{0, 0, 0, 0, 0, 0, 0, 1, 0, 0, 0, 0, 0, 0, 0, 0\} \qquad (1)$$
$$\uparrow$$
$$\text{failure bit}$$

In this signal, only one position ($x(7)$) has the value of "1" and all of the remaining positions are "0s". In this specification, a position having the value of "1" is called failure bit. In addition, a failure bit position is called failure address.

When the signal of above (1) is Haar-Wavelet-transformed, the following result $X(N)$ shown by (2) is obtained.

$$X(N) = \{0, 0, 0, 1/2, 0, 0, 0, 0 \mid 0, 0, 0, -1/2, 0, 0, 0, 0\} \qquad (2)$$
$$\text{scaling function} \quad \text{Wavelet function}$$
$$\text{(low-pass component)} \quad \text{(high-pass component)}$$

The result of the Wavelet-transforming process is called Wavelet coefficient. A failure bit of the input signal $x(n)$ has been detected at a Wavelet coefficient $X(11)$ in the high-pass component. In this manner, Wavelet-transform has a nature or attribute of detecting a failure bit.

Next, the following (3) in which the failure address of the input signal given by the above (1) is shifted to the right hand by one position is given as an input signal, and Haar-Wavelet-transform is applied to the input signal. As a result, the following result $X(N)$ shown by (4) is obtained.

$$x(n) = \{0, 0, 0, 0, 0, 0, 0, 0, 1, 0, 0, 0, 0, 0, 0, 0\} \qquad (3)$$
$$\uparrow$$
$$\text{failure bit}$$

$$X(N) = \{0, 0, 0, 0, 1/2, 0, 0, 0 \mid 0, 0, 0, 0, 1/2, 0, 0, 0\} \qquad (4)$$
$$\text{scaling function} \quad \text{Wavelet function}$$
$$\text{(low-pass component)} \quad \text{(high-pass component)}$$

In such a manner, when the position of value "1" is shifted by one sample, the sign of the Wavelet coefficient in the high-pass components is inverted.

Each of the input signals (1) and (3) is a delta function. In general, the high-pass component $X(N)$ of the Haar-Wavelet-transformed result of a delta function $\delta(\tau-k)$ {k=2i-1, k=2i; i is a natural number} is given by the following formula (5).

$$X(N) = \frac{1}{2}\delta\left(\tau - \frac{k-1}{2}\right) \quad k = 2i-1 \qquad (5)$$
$$X(N) = -\frac{1}{2}\delta\left(\tau - \frac{k}{2}\right) \quad k = 2i-1$$

In such manner, the sign of a Wavelet coefficient is changed depending on the failure address. Inversely, the failure address k of the input signal can be found from an address j and the sign S of a failure bit $(S/2)\delta(\tau-j)$ of the high-pass component as follows:

in the case of S>0, k=2j in the case of S<0, k=2j+1 $\qquad$ (6)

As discussed above, a failure address can be detected by utilizing Wavelet-transform. However, when Haar-Wavelet-transform is used, it is necessary to sort a failure address case by case depending on the sign of the Wavelet coefficient in order to accurately find a failure address. If the redundant Haar-Wavelet-transform explained in the following is utilized, a failure address can be accurately found without sorting it case by case.

In a usual Haar-Wavelet-transform, a sampling is performed by shifting the basic function by two signals relative to the input signal. On the contrary, in the redundant Haar-Wavelet-transform, a sampling is performed by repeating the shifting of the basic function by one signal relative to the input signal in the arithmetic and logical operation or calculation of the high-pass component. When the redundant Haar-Wavelet-transform is applied to an input signal $x(n)$, the following transformation result $X(N)$ can be obtained.

| low-pass component (scaling function) | high-pass component (Wavelet function) |
|---|---|
| $X(0) = g0 \cdot x(0) + g1 \cdot x(1)$, | $X(8) = h0 \cdot x(0) + h1 \cdot x(1)$ |
| $X(1) = g0 \cdot x(2) + g1 \cdot x(3)$, | $X(9) = h0 \cdot x(1) + h1 \cdot x(2)$ |
| $X(2) = g0 \cdot x(4) + g1 \cdot x(5)$, | $X(10) = h0 \cdot x(2) + h1 \cdot x(3)$ |
| . | . |
| . | . |
| . | . |
| $X(7) = g0 \cdot x(14) + g1 \cdot x(15)$, | $X(22) = h0 \cdot x(14) + h1 \cdot x(15)$ |

$X(7)=g0 \cdot x(14)+g1 \cdot x(15)$, $X(22)=h0 \cdot x(14)+h1 \cdot x(15)$

When this redundant Haar-Wavelet-transform is applied to an input signal $\delta(\tau-k)$, the high-pass component $X(N)$ thereof is given by the following formula (7).

$$X(N) = -\frac{1}{2}\delta(\tau-k) + \frac{1}{2}\delta(\tau-k-1) \qquad (7)$$

As described above, since both positive and negative Wavelet coefficients are detected from one failure bit, a failure address can accurately be found by extracting either one of the two Wavelet coefficients. That is, an address k itself by which the δfunction is found in the formula (7) becomes the failure address.

Next, two-dimensional Wavelet-transform will be described.

Wavelet-transform can also be applied to a two-dimensional image data. Examples in which Wavelet-transform is applied to specific image data are shown in the aforementioned reference literature and other documents or publications in which Wavelet-transform is explained.

Figure 8A:
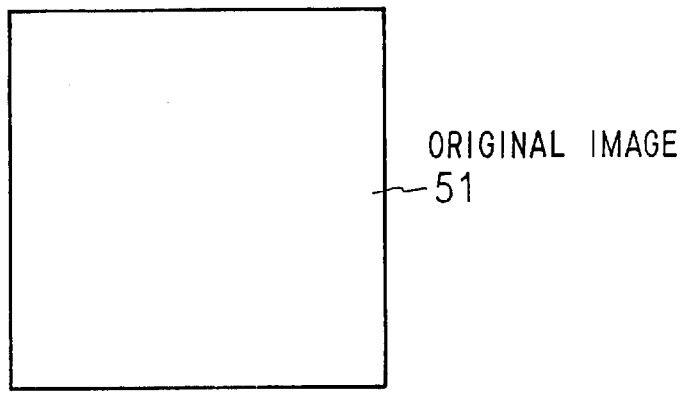
FIG. 8(A) shows the original image.
Figure 8B:
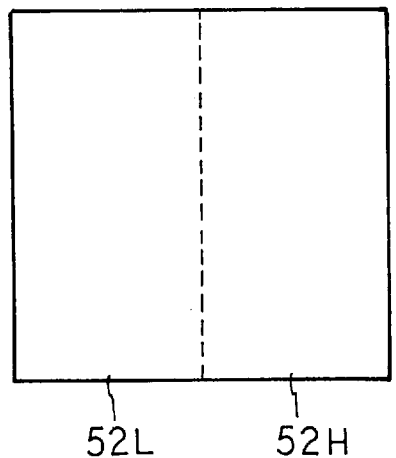
FIG. 8(B) shows the one-dimensional Wavelet-transformed image.
Figure 8C:
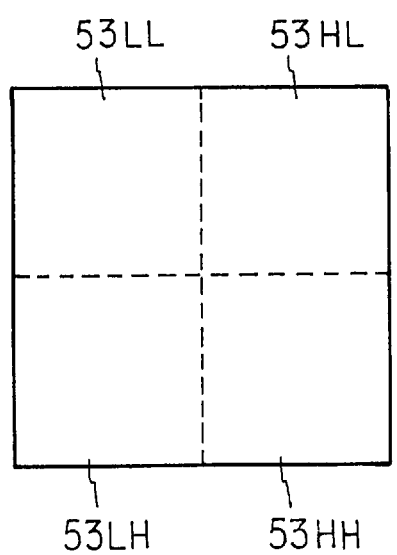
FIG. 8(C) shows the two-dimensional Wavelet-transformed image.

It is assumed that an original image 51 shown in FIG. 8(A) is, for example, digital data having 512×512 bits. The one-dimensional Wavelet-transform is first applied to this image 51 in the X-axis direction. That is, Wavelet-transform applied to the 512 signals in the X-axis direction is repeated 512 times in the Y-axis direction. An image shown in FIG. 8(B) is obtained by this process. In the image shown in FIG. 8(B), the picture or screen of the original image 51 shown in FIG. 8(A) is longitudinally divided into two pieces (left and right side pictures), and the low-pass information (L) 52L is stored in the left side picture and the high-pass information (H) 52H is stored in the right side picture. Next, the same one-dimensional Wavelet-transform is applied to the image shown in FIG. 8(B) in the Y-axis direction. By this process, an image shown in FIG. 8(C) is obtained. In the image shown in FIG. 8(C), the picture of FIG. 8(B) is further laterally divided into two pieces (upper and lower side pictures), and the low-pass information (L) is stored in the upper side picture and the high-pass information (H) is stored in the lower side picture.

As a result, in the image shown in FIG. 8(C), the original picture is divided into four pieces or blocks, and the low-pass information of X-axis and Y-axis directions (LL component) 53 LL is stored in the upper left side picture, the combined information of the high-pass information of X-axis direction and the low-pass information of Y-axis direction (HL component) 53 HL is stored in the upper right side picture, the combined information of the low-pass information of X-axis direction and the high-pass information of Y-axis direction (LH component) 53 LH is stored in the lower left side picture, and the high-pass information of X-axis and Y-axis directions (HH component) 53 HH is stored in the lower right side picture.

A high-pass filter calculates an amount of local change of the pixel value. The high-pass filter is applied to the LH component 53 LH of the image shown in FIG. 8(C) in the vertical direction, and hence a change of the pixel value in the vertical direction, i.e., an edge component running in the lateral direction is detected. That is, in two-dimensional Wavelet-transform, the LH component 53LH detects an edge of lateral direction (hereinafter referred to as lateral line component) and is the HL component 53HL detects an edge of longitudinal direction (hereinafter referred to as longitudinal line component). In addition, the HH component 53HH to which the high-pass filter is applied in both X and Y directions, detects an edge of the direction of 45° (hereinafter referred to as slant line component). In this specification, the processed image shown in FIG. 8(C) has been obtained by firstly transforming the image in X-axis direction and secondly transforming it in Y-axis direction. However, even if the sequence of the transforming processes is changed inversely, the result of two-dimensional Wavelet-transform brings the very same image as that shown in FIG. 8(C).

Figure 9:
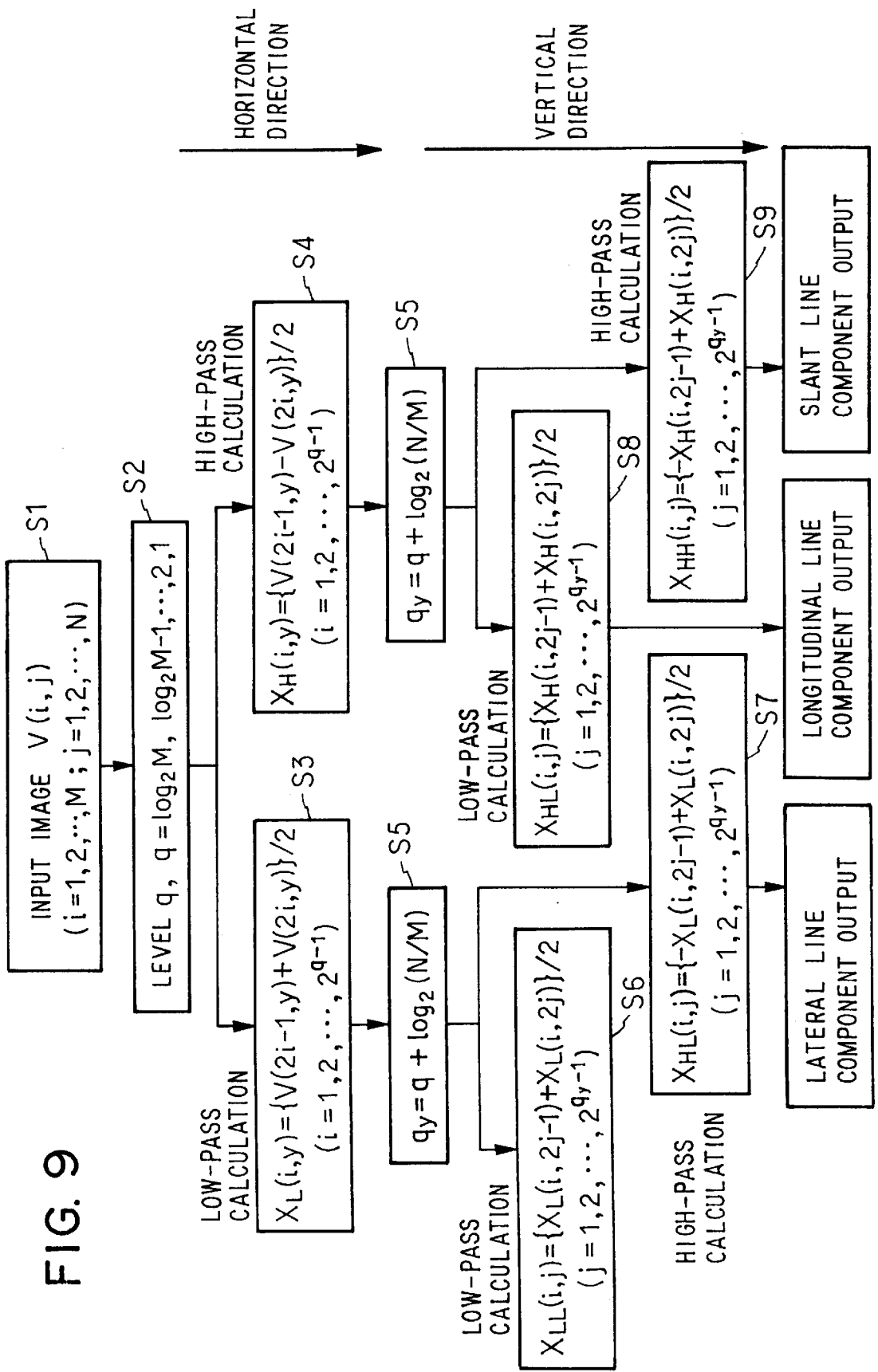
FIG. 9 is a flow-chart showing a procedure of process of two-dimensional Haar-Wavelet transforming means for a two-dimensional image V(x, y).

FIG. 9 shows an example of the procedure of process of this two-dimensional Haar-Wavelet-transform. A two-dimensional image V(i,j) (i=1, 2, . . . , M; j=1, 2, . . . ; N; i corresponds to an X-axis address and j corresponds to a Y-axis address) is inputted (S1). First, a level q, $q=\log_2 M$, $\log_2 M-1, \ldots, 2, 1$ is calculated (S2), and for each of the levels q, a low-pass calculation or arithmetic operation (S3) and a high-pass calculation or arithmetic operation (S4) are performed. That is, in the low-pass calculation, the following calculation is performed:

$$X_L(i, y)=\{V(2i-1, y)+V(2i, y)\}/2 (i=1, 2, \ldots, 2^{q-1})$$

In the first transforming calculation in the X direction (horizontal direction), a low-pass calculation $X_L(i, y)$ and a high-pass calculation $X_N(i, y)$ are performed for i from i=1 to $i=2^{q-1}$, that is, to $(\log_2 M)$ power, namely, to M.

Next, $q_y=q+\log_2(N/M)$ is calculated (S5), and with respect to $X_L(i, y)$, a low-pass calculation $X_{LL}(i, j)=\{X_L(i, 2j-1)+X_L(i, 2j)\}/2$, (j=1, 2, . . . , $2^{qy-1}$) is calculated (S6). In addition, a high-pass calculation $X_{LH}(i, j)=\{X_L(i, 2j-1)+X_L(i, 2j)\}/2$, (j=1, 2, . . . $2^{qy-1}$) is calculated (S7). When q is equal to $\log_2 M$ ($q=\log_2 M$), each of the calculations $X_{LL}(i, j)$ and $X_{LH}(i, j)$ is performed for j from j=1 to j=N. Similarly, for $X_H(i, y)$, a low-pass calculation $X_{HL}(i, j) =\{X_H(i, 2j-1)+X_H(i, 2j)\}/2$, (j=1, 2, . . . , $2^{qy-1}$) is calculated (S8). In addition, a high-pass calculation $X_{HH}(i, j)=\{-X_H(i, 2j-1)+X_H(i, 2j)\}/2$, (j=1, 2, . . . , $2^{qy-1}$) is calculated (S9). In this case, also, when q is equal to $\log_2 M$ ($q=\log_2 M$), the calculation is performed for j from J=1 to j=N.

In the present invention, two-dimensional Wavelet- transform is applied to a binary image of an inputted fail bit map, and the result of two-dimensional Wavelet-transform is observed as an image and failure bit information such as a failure address and the number of failures is automatically extracted and outputted, or from this Wavelet-transformed result, the failure bit information is automatically extracted and outputted.

Now, it will be specifically explained that the failure bit information can be detected by applying a two-dimensional Wavelet-transform to a fail bit map.

Figure 1B:
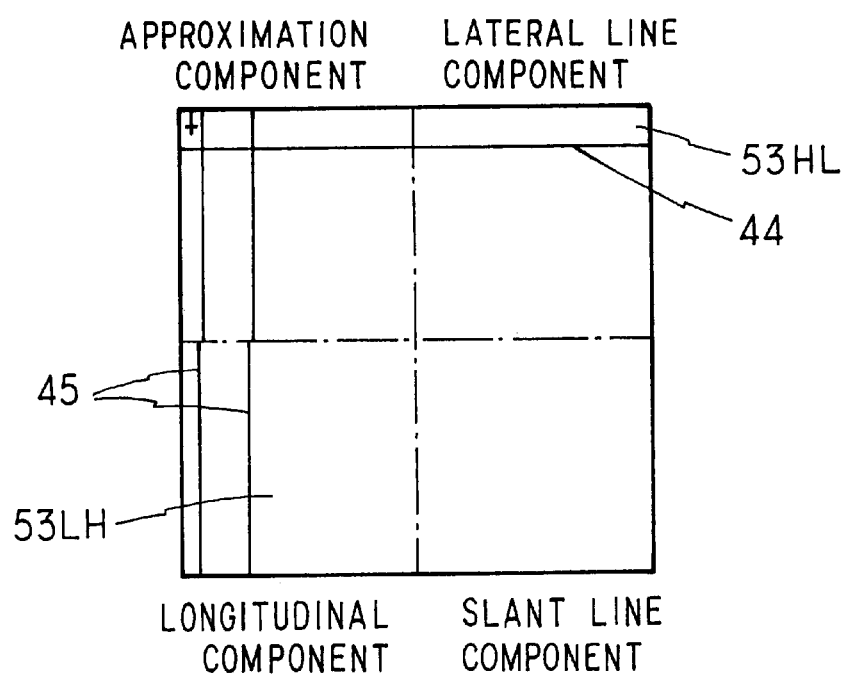
FIG. 1(B) is a diagram showing an image obtained by applying two-dimensional Wavelet-transform to the image shown in FIG. 1(A)

FIG. 1(A) shows an example of the fail bit map. Failure bits exist, as illustrated, as a straight line 41 running in the horizontal direction, as a straight line 42 running in the vertical direction, or as an isolated point 43. When the two-dimensional Wavelet-transform is applied to this fail bit map, as shown in FIG. 1(B), the failure bits in the horizontal direction (the straight line 41) are detected in the upper right side image 53HL as a lateral line component 44, and the failure bits in the vertical direction (the straight line 42) are detected in the lower left side image 53LH as a longitudinal line component 45. Therefore, the failure addresses and the number of failures can be analyzed by displaying and observing the Wavelet-transformed result. In addition, since each component is given as a quarter size of the inputted image, it is possible to display and analyze the failure bit information on a single screen even if the memory capacity of a memory device is increased.

Consequently, in the failure analyzing method according to the present invention, as shown in FIG. 2, an inputted fail bit map is two-dimensional Wavelet-transformed (S1), and Wavelet coefficients are added up for each of the X addresses with respect to the X directional high-pass and Y directional low-pass information $X_{HL}$ in the result of two-dimensional Wavelet-transform, thereby to create an X address histogram, and in addition, Wavelet coefficients are added up for each of the Y addresses with respect to the X directional low-pass and Y directional high-pass information $X_{LH}$ in the result of two-dimensional Wavelet-transform, thereby to create a Y address histogram (S2). A failure X address and a failure Y address are detected from an X address and a Y address each having an added value other than zero in the X address histogram and the Y address histogram, respectively (S3). Moreover, the number of failures is found from the added value at each of the failure addresses (S4).

Figure 3A:
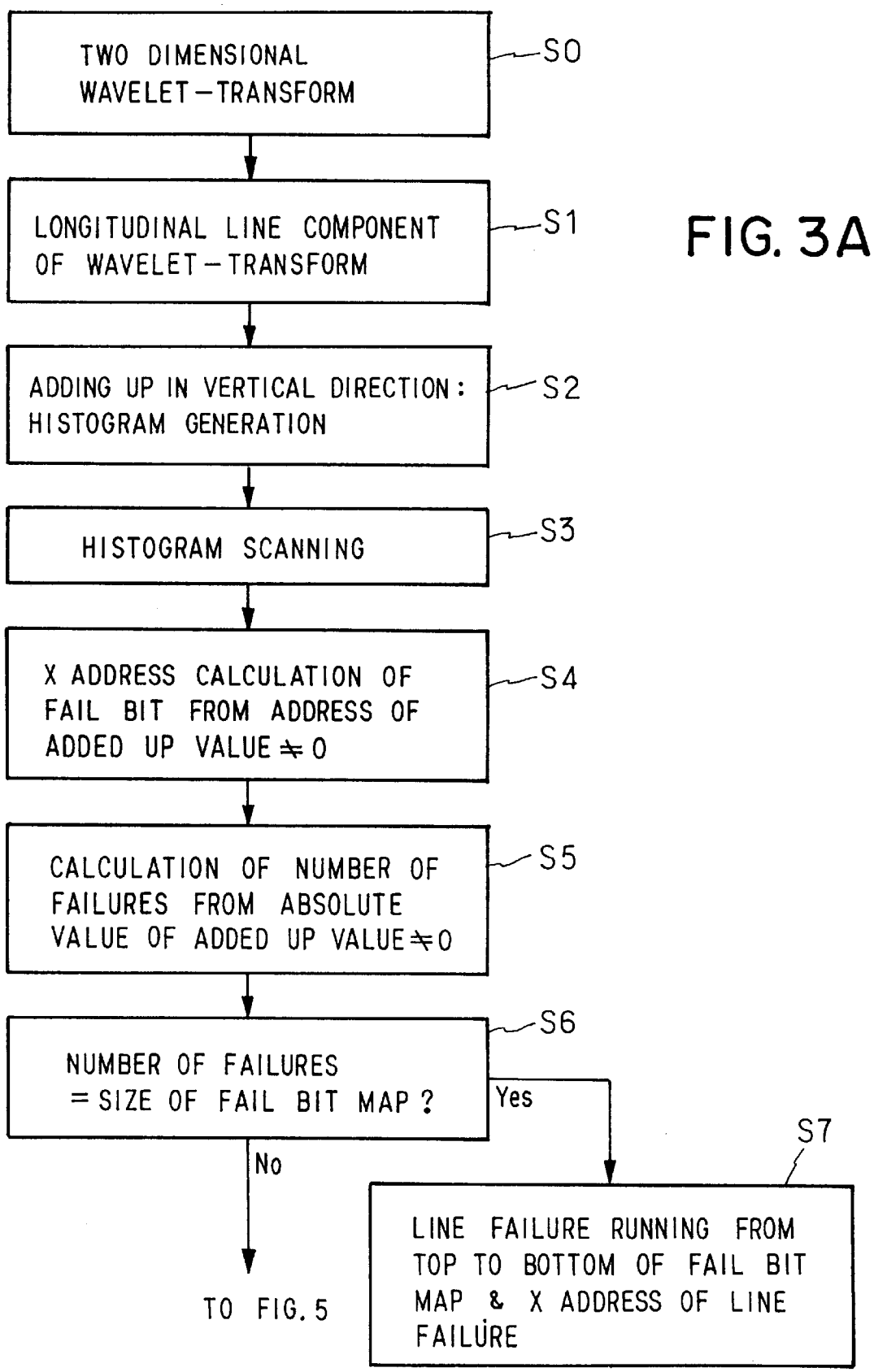
FIG. 3(A) is a flow-chart showing an embodiment of the failure analyzing method according to the present invention.
Figure 3B:
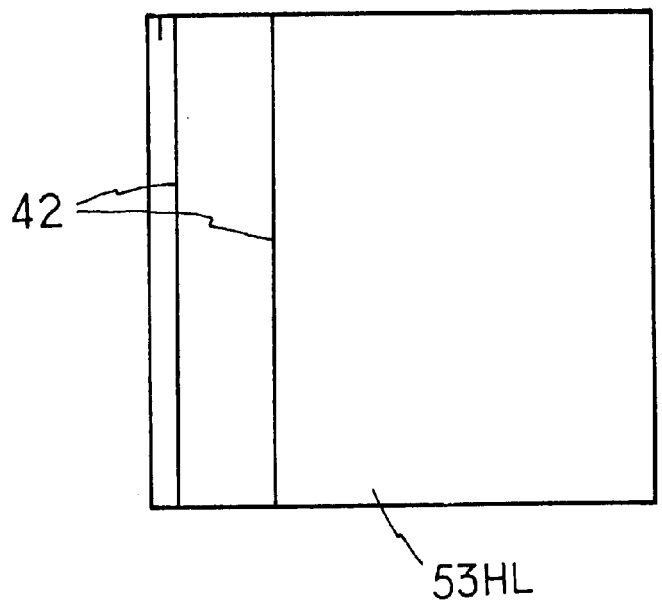
FIG. 3(B) is a diagram showing an example of the image of X directional high-pass and Y directional low-pass information (longitudinal line detection component) in the result of Wavelet-transform.

One specific example of the failure analyzing method according to the present invention will be described with reference to FIG. 3. As shown in the flow chart shown in FIG. 3 (A), first, an inputted fail bit map is two-dimensional Wavelet-transformed (S0). In order to simplify the explanation, Y directional failure bit information, i.e., X directional high-pass and Y directional low-pass information $X_{HL}(i, j)$ including a longitudinal line component is acquired (S1). In the image 53HL thereof, for example as shown in FIG. 3(B), line failures in the vertical (Y) direction appear as longitudinal lines 42.

Figure 3C:
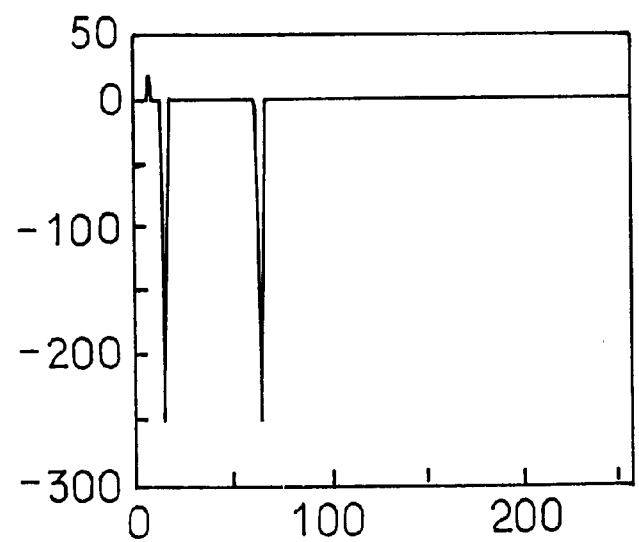
FIG. 3(C) is a diagram showing an example of the histogram of the X directional high-pass and Y directional low-pass information.
Figure 4B:
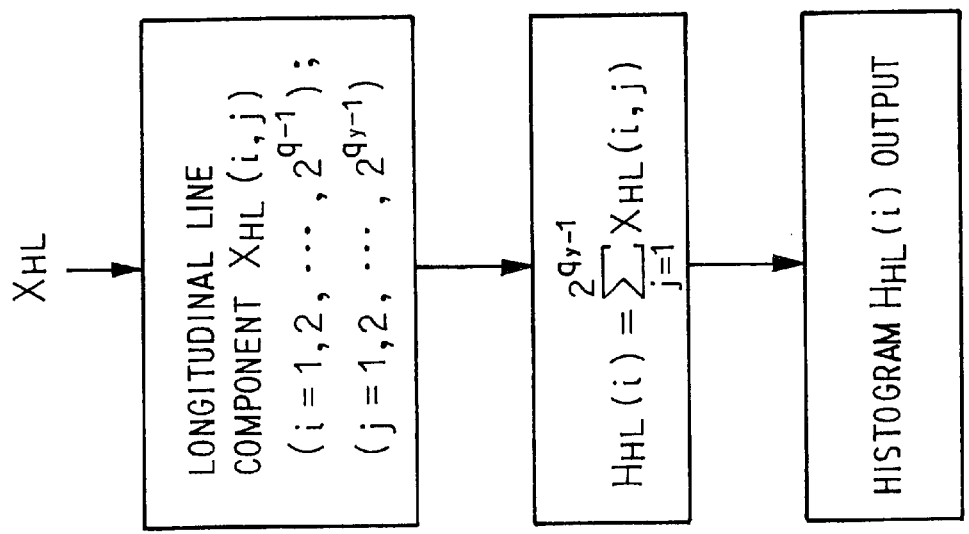
FIG. 4(B) is a flow chart showing a procedure of process for producing a Y address histogram.
Figure 4A:
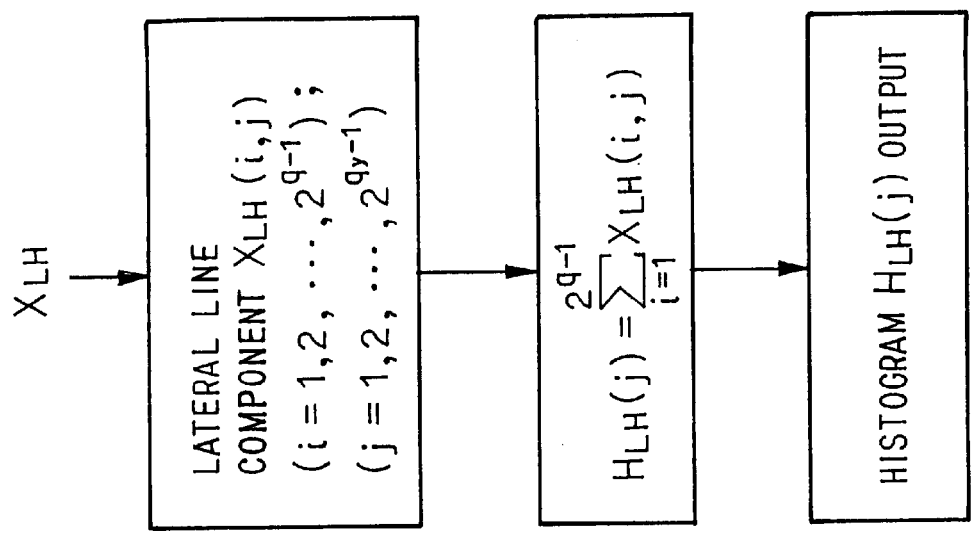
FIG. 4(A) is a flow chart showing a procedure of process for producing an X address histogram.

Although not shown in FIG. 3, a detection of failure bit information in the horizontal direction is similarly performed. Next, Wavelet coefficients of a longitudinal line component in the Wavelet-transformed result are added up in the longitudinal direction to create a histogram (S2). FIG. 4(A) shows a flow chart of process of histogram producing means. That is, with respect to the low-pass information $X_{HL}$ in the vertical transformation in FIG. 9, $H_{HL}(i)=\rho X_{HL}(i, j)$ ($\Sigma$ is for j from j=1 to j=$2^{qy-1}$) is calculated. That is, with respect to each X address i, the Wavelet coefficients $X_{HL}(i, j)$ are added up for Y addresses from j=1 to j=$2^{qy-1}$. In the case of M=N=512 as in the aforementioned example, for each i from i=1 to i=256, the $X_{HL}(i, j)$ in (i, j) for each j from j=1 to j=256 are added up. In this manner, an X address histogram is created. The X address histogram for the Wavelet-transformed image 53HL is as shown in FIG. 3(C). FIG. 4(B) shows a process of producing a Y address histogram with respect to high-pass information $X_{LH}$ in the vertical transformation.

Returning back to FIG. 3(A), in the created X address histogram, an address having a failure bit in the vertical (Y) direction takes a value other than zero, and an address having no failure bit takes a value of zero. Therefore, the obtained histogram is scanned (S3) and an address having an added value other than zero is searched (S4). When an added value other than zero is detected, that address is stored in a memory as an X address for a failure bit in the vertical direction. In the case that Haar-Wavelet-transform is utilized, as discussed in the previous paragraph of the explanation of Wavelet-transform, the sign of the added value is changed depending on whether the X address of the failure bit is even address or odd address. Therefore, an accurate X address can be obtained using the formula (6). In the case that the redundant Haar-Wavelet-transform is utilized, an attention is paid only to a position or positions in which the sign of the added value other than zero becomes positive or negative. When an address detected using the redundant Haar-Wavelet-transform is assumed to be Xaddr, an X address of the actual failure bit is stored in the memory as $X_{addr}$–1 when the added value is positive, and as Xaddr when the added value is negative.

Next, the number of failures is calculated (S5). The number of failures is expressed by an added value of the histogram. When Haar-Wavelet-transform is utilized, a value of twice the absolute value of the added value becomes the number of failures. When the redundant Haar-Wavelet-transform is utilized, the absolute value of the added value itself becomes the number of failures. However, if the obtained number of failures is smaller than the size of the fail bit map, it is necessary to determine whether the number of failures bits forms a line of consecutive failure bits or forms a set of plural lines of failure bits as well as to find a Y address of each failure bit. The process for realizing this will be shown in the following.

Figure 5:
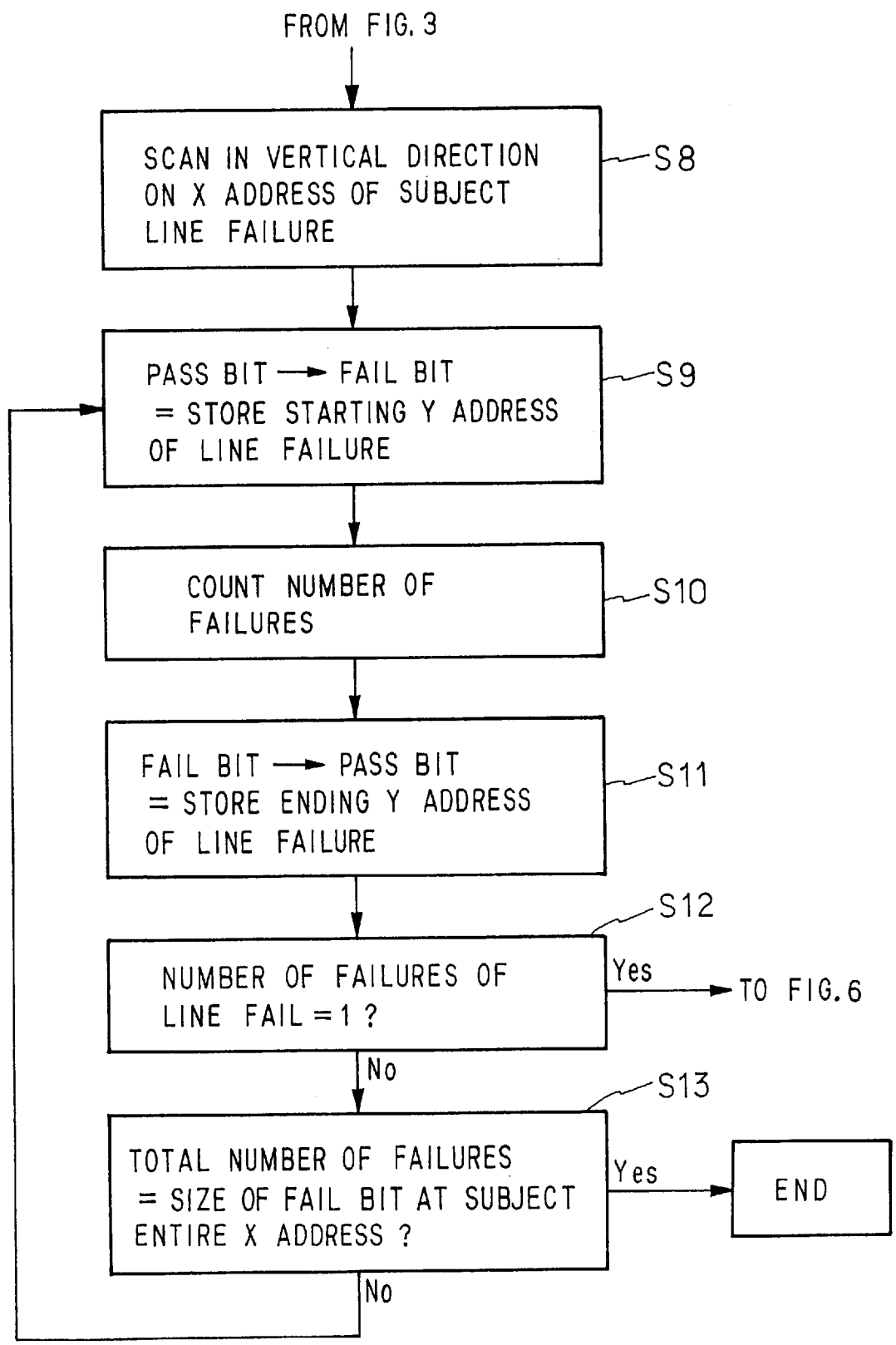
FIG. 5 is a flow-chart showing an example of a procedure of process for finding a line failure address and the number of failures, which corresponds to the steps S4 and S5 shown in FIG. 3(A)

First, when the calculated number of failures is equal to the size or amount of the inputted fail bit map (Yes of S6), it is considered that the failure bits form a line-shaped failure running from the top through the bottom of the fail bit map, namely, a line failure. Therefore, in this case, the size of the line failure and its X address are outputted as failure bit information (S7). When the calculated number of failures is smaller than the size or amount of the inputted fail bit map, the following process is performed as shown in FIG. 5.

(a) At the longitudinal line component of Wavelet-transformed result of the fail bit map, or at the X address of the subject line failure in the inputted fail bit map, the Wavelet coefficients or the bit map is scanned from the top through the bottom or from the bottom through the top (S8).

(b) In the scanning process, when a position where a Wavelet coefficient or a bit value changes from a pass bit to a failure bit is detected, the Y address of the position is stored in the memory as a starting point of the line failure (S9).

(c) The scanning process is continued while the size or length of the section where a Wavelet coefficient or a bit value is a failure bit is counted (S10).

(d) When a position where a Wavelet coefficient or a bit value changes from a failure bit to a pass bit is detected, the Y address of the position is stored in the memory as an ending point of the line failure (S11).

(e) If the total number of the counted failures in the line failure is smaller than the number of failures in the line failure at the entire subject X address, the above processes (b) to (d) (S9–S11) are repeated. If the total number of the counted failures in the line failure is equal to the number of failures in the line failure at the entire subject X address, the process ends (S13).

Through the processes described above, the address and the number of failures in each line failure can automatically be obtained and outputted in either case that the number of line failures is one line or plurality of lines.

As a special case, there is a case that a failure bit is detected in which the number of failures is one (S12). There are two factors listed below, where a failure bit in which the number of failures is one is detected in the vertical direction.

($\alpha$) An isolated one bit failure.

($\beta$) A starting or an ending point of a horizontal line failure.

Figure 6:
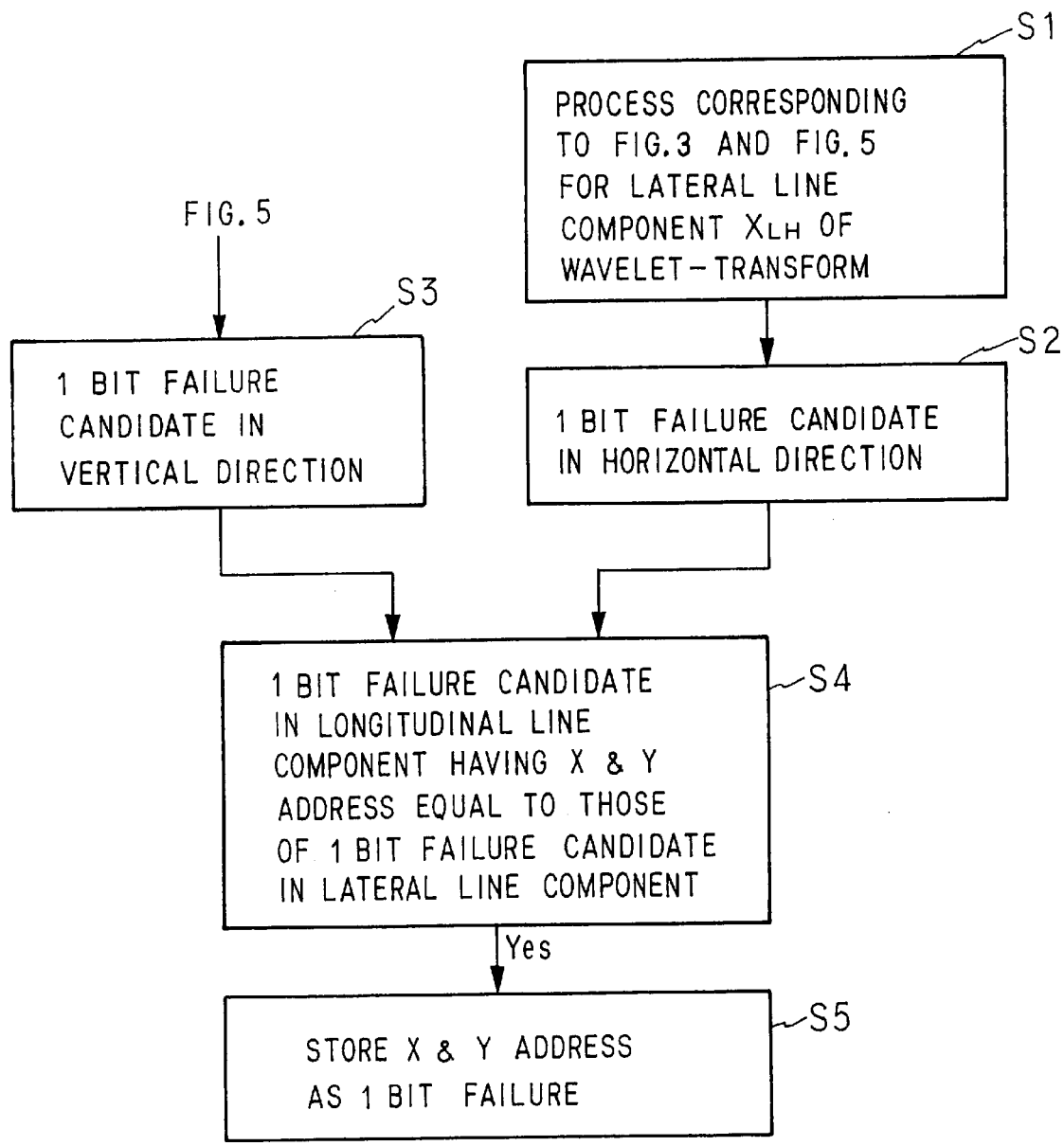
FIG. 6 is a flow-chart showing an example of a procedure of process for determining, when the number of failures in a line failure has been one (1), whether that failure bit is one bit failure or not.

In order to discriminate one of them, the detection result of a horizontal line failure is utilized. That is, as shown in FIG. 6, the same process as shown in FIG. 3 is applied to the lateral line component $X_{LH}(i, j)$ of the Wavelet-transformed result (S1). From the result of (S1), one bit failure candidate in the horizontal direction is obtained (S2), and from the previous processing result, one bit failure candidate in the vertical direction is obtained (S3). While in the case of ($\alpha$), a one bit failure is detected at the same address of the one bit failure obtained in the process on the longitudinal line component. However, in the case of ($\beta$), the failure bit is detected as a starting address or an ending address of a line failure. Therefore, only when a one bit failure candidate is detected at the same address from both of the longitudinal line component and lateral line component (S4), that address is outputted as a one bit failure (S5). When a one bit failure candidate is detected in only one of the longitudinal line component and lateral line component, the one bit failure candidate is ignored.

As explained above, by utilizing two-dimensional Wavelet-transform, the information such as failure addresses and the number of failures can automatically be detected from the fail bit map.

Figure 7:
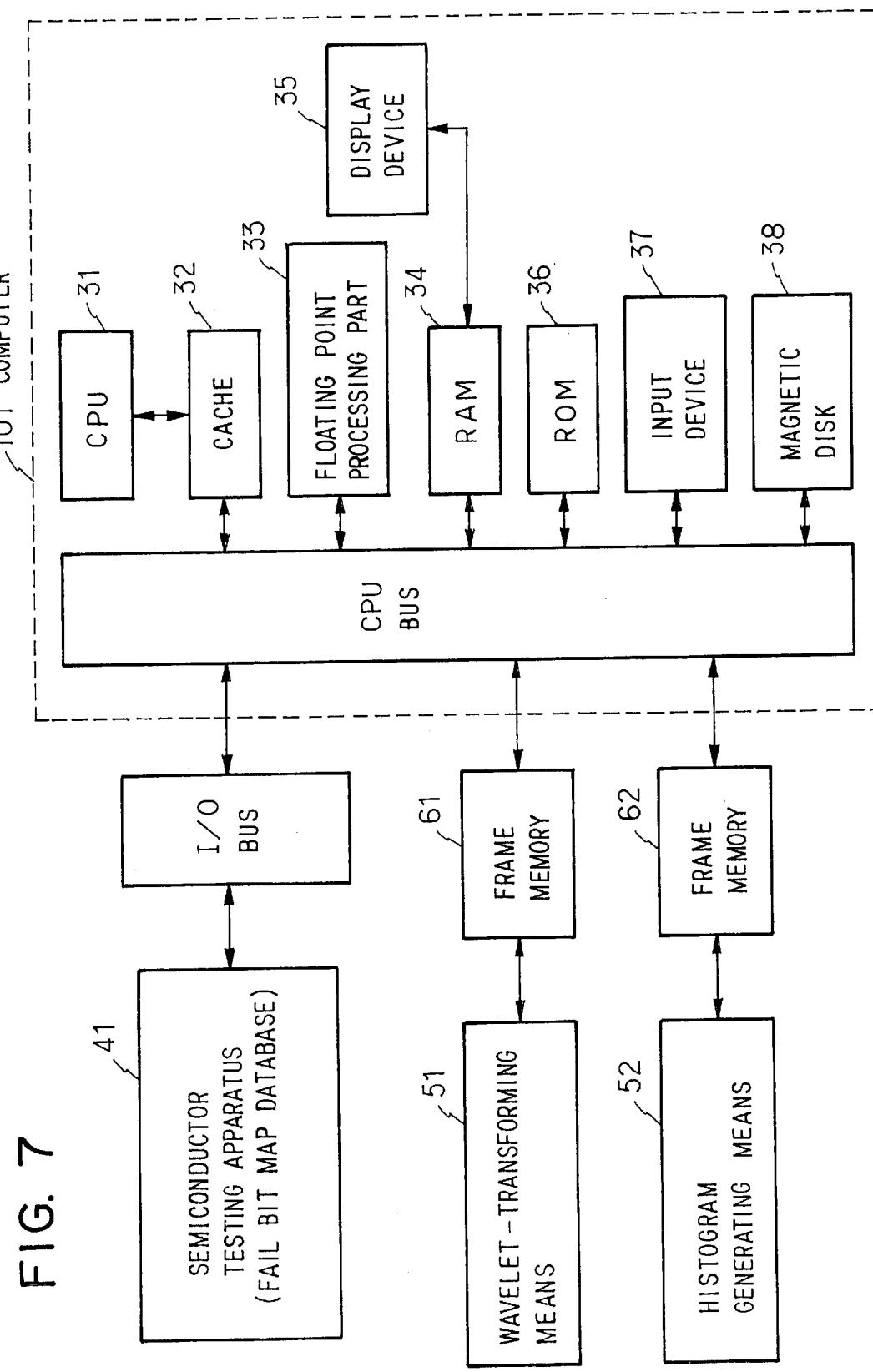
FIG. 7 is a block diagram showing an example of the functional configuration of an image information processing apparatus based on the present invention.

FIG. 7 shows a functional configuration of the failure analyzing apparatus according to the present invention. A computer 101 comprises a CPU 31 for inputting/outputting and performing a calculation, a cache 32 for storing instructions and data to be used frequently to increase the processing speed, a floating point calculation part 33, a RAM 34 and a ROM 36 for storing user inputs and data, a display device 35 for displaying a user selection menu and calculation results, an input device 37 such as a keyboard for inputting parameters and commands and/or a pointing device (mouse or the like), and a magnetic disk drive 38 for storing calculation results and the like.

A fail bit map to be inspected is created by a semiconductor inspecting or testing apparatus 41, or is transferred from a fail bit map data to a RAM 34 on the computer via a bus. A binary image of the inputted fail bit map has, for example, a structure as shown in FIG. 1(A) and in this example, a case of 512×512 size is shown. The fail bit map stored in the RAM 34 is first transferred, as an input data, to a frame memory 61. The two-dimensional Wavelet-transform is applied to this transferred fail bit map by the Wavelet-transforming means 51 and the transformed result is transferred to a frame memory 62. Then a horizontal direction histogram and a vertical direction histogram are created by histogram producing means 52 and are transferred to the RAM 34 on the computer. Next, the histograms are inspected, and addresses each having an added value other than zero and the added value are calculated. The X address histogram generated for the longitudinal line components of Haar-Wavelet-transformed result shown in FIG. 3(B) is as shown in FIG. 3(C). The following information can be obtained from this histogram.

|       | X address | added value |
|-------|-----------|-------------|
| (i)   | 4         | −0.5        |
| (ii)  | 8         | 11.5        |
| (iii) | 15        | −256        |
| (iv)  | 63        | −256        |

Similarly, it is assumed that the following information is obtained from the Y address histogram of the lateral line components.

|        | Y address | added value |
|--------|-----------|-------------|
| (v)    | 0         | −0.5        |
| (vi)   | 7         | 5           |
| (vii)  | 12        | 0.5         |
| (viii) | 31        | −256        |

When an attention is paid to the added values, there are three line failures of (iii), (iv) and (viii) each having the value of −256. Since the value of twice the absolute value of this value is 512, each of the line failures is judged to run from an end to the other end of the fail bit map. From this judgement and the sign of the added value, the addresses of the following 3 line failures are detected using the formula (6).

Line failure in the vertical direction:
two line failures at X addresses 31 and 127.
Line failure in the horizontal direction:
one line failure at Y address 63.

When a starting point and an ending point of the failure bits are obtained for each of the remaining five kinds of failure bits, it is assumed that the result is as follows.

| Longitudinal Line Component: | | |
|---|---|---|
| starting Y address | ending Y address | (X address) |
| (i) 31 | 32 | (9) |
| (ii) 1 | 24 | (16) |

| Lateral Line Component: | | |
|---|---|---|
| starting X address | ending X address | (Y address) |
| (v) 8 | 9 | (1) |
| (vi) 9 | 20 | (14) |
| (vii) 8 | 9 | (23) |

In (i), (v) and (vii), the number of failures of the failure bits is 1. However, since there is no-one bit failure having the same X, Y address in both of the longitudinal line component and the lateral line component, those are ignored.

As a result, it is finally detected that there are a total of 5 line failures of previously obtained 3 line failures and 2 line failures shown below in the inputted fail bit map.

A line failure in the vertical direction:
X address; 16, starting Y address; 1, ending Y address; 24, number of failures; 23.

A line failure in the horizontal direction:
Y address; 14, starting X address; 9, ending X address; 20, number of failures; 11.

The above information is outputted to the display device 35 of the computer as the detection result.

In FIG. 7, the Wavelet-transforming means 51 and the histogram producing means 52 are constructed as the devices independent of the computer 101. However, the processing by the CPU 31 of the computer 101 may be substituted for the processes of these Wavelet-transform and process of producing a histogram.

As is apparent from the foregoing, in accordance with the present inventions, the failure bit analysis can be carried out by keeping the failure address information as it is, which was lost in the conventional image compressing method.

In addition, according to the present invention, the analysis of failure addresses and the number of failures conventionally performed by a person can automatically be performed.

As explained above in detail, according to the present invention, the information such as failure addresses and the number of failures contained in a fail bit map outputted from a semiconductor testing apparatus or a fail bit map database can automatically be detected utilizing two-dimensional Wavelet-transform, and hence a remarkable advantage and effect in terms of the automated inspection or testing steps can be obtained.

While the present invention has been described with respect to the preferred embodiments illustrated herein, it will be apparent to those skilled in the art that various changes, alterations, modifications and minor improvements may be made to the embodiments described above without departing from the spirit and scope of the present invention.

Accordingly, it should be understood that the present invention is not to be limited to the illustrated embodiments but encompasses all changes, alterations, modifications and minor improvements falling within the scope of the invention defined by the appended claims.

What is claimed is:

1. A failure analyzing apparatus for extracting failure information from a fail bit map comprising:

memory; and two-dimensional Wavelet-transforming means for applying two-dimensional Wavelet-transform to an inputted fail bit map stored in said memory.

2. A failure analyzing apparatus for extracting failure information from a fail bit map comprising:

two-dimensional Wavelet-transforming means for applying two-dimensional Wavelet-transform to an inputted fail bit map; and histogram producing means for adding up Wavelet coefficients in Y direction with respect to X directional high-pass and Y directional low-pass information obtained from the two-dimensional Wavelet-transform to create an X address histogram, and for adding up Wavelet coefficients in X direction with respect to X directional low-pass and Y directional high-pass information obtained from the two-dimensional Wavelet-transform to create a Y address histogram.

3. The failure analyzing apparatus according to claim 2 further including:

failure information outputting means for defining as failure addresses an X address having an added value other than zero in the X address histogram obtained by said histogram producing means and a Y address having an added value other than zero in the Y address histogram obtained by said histogram producing means, and outputting the added value of said X address in the histogram and the added value of said Y address in the histogram as the numbers of failures respectively.

4. The failure analyzing apparatus according to claim 3 further including:

decision means for determining whether or not the number of failures is equal to the amount of X address or Y address of the inputted fail bit map; and means for outputting, when said decision means determines that the number of failures is equal to the amount of X address or Y address of the inputted fail bit map, information representing that the failures extend over the corresponding entire X address or Y address.

5. The failure analyzing apparatus according to claim 4 further including:

failure address detecting means for scanning the X address or the Y address in which the failures are present in the inputted fail bit map or in the Wavelet-transformed result of the fail bit map when said decision means determines that the number of failures is not equal to the amount of X address or Y address of the inputted fail bit map, thereby to detect a starting address of the failures and an ending address of the failures.

6. The failure analyzing apparatus according to claim 5 further including:

determining means for determining whether or not the number of failures is one; and one bit failure determining means for determining whether or not the failure is a one bit failure when said determining means determines that the number of failures is one.

7. The failure analyzing apparatus according to any one of claims 1 to 6, wherein a basic function of said two-dimensional Wavelet-transforming means is a redundant Haar-Wavelet-transform in which a shift parameter for Haar-Wavelet-transform is set to 1.

8. A failure analyzing method comprising the steps of:

applying two-dimensional Wavelet-transform to an inputted fail bit map;

adding up Wavelet coefficients, with respect to a component including high-pass information obtained from the two-dimensional Wavelet-transform, in a specified direction of high-pass information producing process to create a histogram; and analyzing a failure address and the number of failures from the histogram.

9. The failure analyzing method according to claim 8 further including the step of:

finding a failure address based on an address having an added value other than zero in the histogram, and finding the number of failures for the failure bit from the added value in the histogram of the address corresponding to the failure address.

10. The failure analyzing method according to claim 9 further including the steps of:

determining whether or not the failure bit of the found failure address extends over the corresponding entire address in the fail bit map from the number of the failure bit; and when the failure bit of the found failure address does not extend over the corresponding entire address in the fail bit map, scanning the inputted fail bit map or the Wavelet-transformed result at the failure address to find a starting address of the failures and an ending address of the failures as well as the number of failures present between the starting address and the ending address.

11. The failure analyzing method according to claim 10 further including the step of:

adding up Wavelet coefficients in the direction of high-pass information producing process orthogonal to the specified direction of high-pass information producing process to create a second histogram when the failure number of the failure bit is one, applying a similar processing to said second histogram to find a failure address and the number of failures, and determining whether the failure is one bit failure or not using the failure address and the number of failures as well as the previously found failure address and the number of failures.

* * * * *